United States Patent
Too

(10) Patent No.: US 7,860,599 B2
(45) Date of Patent: Dec. 28, 2010

(54) LID ATTACHMENT MECHANISM

(75) Inventor: Seah Sun Too, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 341 days.

(21) Appl. No.: 11/693,156

(22) Filed: Mar. 29, 2007

(65) Prior Publication Data
US 2008/0242001 A1    Oct. 2, 2008

(51) Int. Cl.
*G06F 19/00* (2006.01)

(52) U.S. Cl. ...................................... 700/121

(58) Field of Classification Search .............. 700/212, 700/229, 121; 438/15, 118; 257/753, 783, 257/787
See application file for complete search history.

(56) References Cited

U.S. PATENT DOCUMENTS

| | | | | |
|---|---|---|---|---|
| 6,695,571 | B1 * | 2/2004 | Canella | 414/801 |
| 6,870,258 | B1 * | 3/2005 | Too | 257/704 |
| 6,936,501 | B1 * | 8/2005 | Too et al. | 438/122 |
| 7,198,980 | B2 * | 4/2007 | Jiang et al. | 438/107 |
| 7,400,036 | B2 * | 7/2008 | Tan | 257/704 |
| 2004/0056338 | A1 * | 3/2004 | Crowley et al. | 257/676 |
| 2008/0029904 | A1 * | 2/2008 | Yong et al. | 257/778 |

OTHER PUBLICATIONS

Sutcliffe, Roger; "Receptacle Carriers Promote Efficient Assembly"; Mar. 15, 2005; Mill-Mae MFG. Corp. pp. 1.*

* cited by examiner

*Primary Examiner*—Albert DeCady
*Assistant Examiner*—Chad Rapp
(74) *Attorney, Agent, or Firm*—Timothy M. Honeycutt

(57) ABSTRACT

Apparatus and methods for assembling semiconductor chips packages are provided. In one aspect, a method of manufacturing is provided that includes placing a first set of semiconductor chip package substrates in a first group of receptacles of a first processing station. Each of the first set of semiconductor chip package substrates has a first footprint. The receptacles of the first group being dimensioned to accommodate the first footprint. A second set of semiconductor chip package substrates is placed in a second group of receptacles of the first processing station. Each of the second set of semiconductor chip package substrates has a second footprint larger than the first footprint. The receptacles of the second group being dimensioned to accommodate the second footprint. A first set of lids is placed on the first set of semiconductor chip package substrates and a second group of lids is placed on the second set of semiconductor chip package substrates.

27 Claims, 5 Drawing Sheets ures. The lid 110 is advantageously composed of a material with a relatively high thermal conductivity to facilitate the transfer of heat from the chip to the ambient.

LID ATTACHMENT MECHANISM

BACKGROUND OF THE INVENTION

1. Field of the Invention

This invention relates generally to semiconductor processing, and more particularly to methods and apparatus for assembling semiconductor chip packages.

2. Description of the Related Art

Many current integrated circuits are formed as multiple die on a common silicon wafer. After the basic process steps to form the circuits on the die are complete, the individual die are cut from the wafer. The cut die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and substrate interconnects to establish ohmic contact. An underfill material is deposited between the die and the substrate to act as a cushion and an adhesive to hold the die. After the die is mounted to the substrate, a lid is attached to the substrate to cover the die. Some conventional integrated circuits, such as microprocessors, generate sizeable quantities of heat that must be ferried away to avoid device shutdown or damage. For these devices, the lid serves as both a protective cover and a heat transfer pathway.

The attachment of a lid to a die substrate involves a complex choreography of steps. A thermal interface material must be applied to the die. An adhesive must be applied to the substrate and cured in such a way that does not produce unwanted irregularities in the thickness or wetting of the thermal interface material. The lid must be attached to the substrate so that the tilt of the lid relative to the die is within acceptable tolerances. High tilt can lead to nonuniformities in thermal interface material thickness, which can produce poor heat transfer characteristics.

One conventional apparatus for assembling packages is the model LAS64 manufactured by Dai-Ichi Seiko. This conventional machine includes several processing stations that perform various stages of lid-to-substrate assembly. A feature common to these processing stations is the capability to handle only a single package size. However, many semiconductor devices, particularly those newer devices incorporating large or multiple die, are made in a variety of sizes. Separate machines are needed for each size.

The present invention is directed to overcoming or reducing the effects of one or more of the foregoing disadvantages.

SUMMARY OF THE INVENTION

In accordance with one aspect of the present invention, a method of manufacturing is provided that includes placing a first set of semiconductor chip package substrates in a first group of receptacles of a first processing station. Each of the first set of semiconductor chip package substrates has a first footprint. The receptacles of the first group are dimensioned to accommodate the first footprint. A second set of semiconductor chip package substrates is placed in a second group of receptacles of the first processing station. Each of the second set of semiconductor chip package substrates has a second footprint larger than the first footprint. The receptacles of the second group are dimensioned to accommodate the second footprint. A first set of lids is placed on the first set of semiconductor chip package substrates and a second group of lids is placed on the second set of semiconductor chip package substrates.

In accordance with another aspect of the present invention, a method of manufacturing is provided that includes placing a first set of semiconductor chip package substrates in a first group of receptacles of a first processing station. Each of the first set of semiconductor chip package substrates includes a semiconductor chip coupled thereto and has a first footprint. The receptacles of the first group are dimensioned to accommodate the first footprint. A second set of semiconductor chip package substrates is placed in a second group of receptacles of the first processing station. Each of the second set of semiconductor chip package substrates includes a plurality of semiconductor chip cores coupled thereto and has a second footprint larger than the first footprint. The receptacles of the second group are dimensioned to accommodate the second footprint. A first set of lids is placed on the first set of semiconductor chip package substrates and a second group of lids is placed on the second set of semiconductor chip package substrates.

In accordance with another aspect of the present invention, an apparatus is provided that includes a first processing station that includes a first group of receptacles dimensioned to accommodate semiconductor chip package substrates that have a first footprint and a second group of receptacles dimensioned to accommodate semiconductor chip package substrates that have a second footprint larger than the first footprint.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
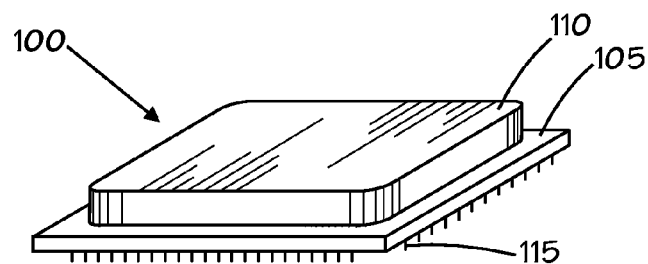
FIG. 1 is a pictorial view of an exemplary embodiment of a semiconductor chip package.

In the drawings described below, reference numerals are generally repeated where identical elements appear in more than one figure. Turning now to the drawings, and in particular to FIG. 1, therein is shown a pictorial view of an exemplary embodiment of a semiconductor chip package 100. The package 100 includes a base substrate 105 and a lid 110 seated on the base substrate 105. The base substrate has a plurality of downwardly projecting conductor pins 115 that establish electrical interconnects with a semiconductor chip (not visible) that is enclosed within the lid 110.

The base substrate 105 may be a printed circuit board and composed of well-known plastics, ceramics, or other materials commonly used for integrated circuit packaging. The base substrate 115 may be a single layer or multilayer structure as desired.

The lid 110 is advantageously composed of a material or materials with a relatively favorable conductive heat transfer coefficient. In an exemplary embodiment, the lid 110 consists of a copper core surrounded by a nickel jacket. However, other materials may be used for the lid 110, such as anodized aluminum, aluminum-silicon-carbide, aluminum nitride, boron nitride or the like. The lid 110 is generally rectangular and may be substantially square if desired.

Figure 2:
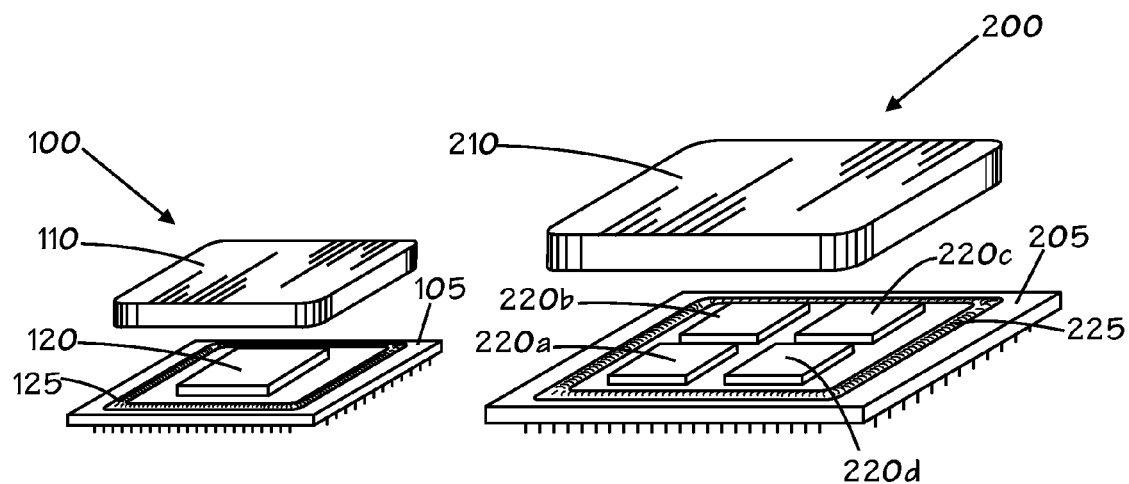
FIG. 2 is a pictorial view of the exemplary package of FIG. 1 along side another exemplary embodiment of a semiconductor chip package with both shown partially exploded.

FIG. 2 depicts a pictorial view of the package 100 in which the lid 110 is shown exploded from the base substrate 105. An integrated circuit 120 is seated on the base substrate 105 and a bead of adhesive 125 is provided on the upper surface of the substrate 105 to adhesively secure the lid 110 to the base substrate 105. The integrated circuit 120 may be a semiconductor die or other type of device. The integrated circuit 105 may be any of a myriad of different types of circuit devices used in electronics, such as, for example, microprocessors, graphics processors, application specific integrated circuits, memory devices or the like. If implemented as a processor, the integrated circuit 120 may be single or multi-core.

FIG. 2 also depicts another semiconductor chip package 200 that includes a base substrate 205 and an overlying lid 210 that is shown exploded from the base substrate 205. Four semiconductor die or chips 220a, 220b, 220c and 220d are positioned on the base substrate 205, and like the package 100, the lid 210 is secured to the base substrate 205 by way of an adhesive bead 225. The base substrate 215 also includes a plurality of downwardly projecting conductor pins 215 to provide electrical interconnects as described generally with regard to the package 100. The substrate 205 and the lid 210 may be made from the same materials used to fashion the substrate 105 and the lid 110. The semiconductor chips 220a, 220b, 220c and 220d may be discreet, that is, differently functioned integrated circuits or may be separate processor cores that are tied together electronically to provide some common functionality, or may be part of a larger integrated circuit that includes multiple processing cores on a single die. Regardless of the particular functionality of the semiconductor chips 220a, 220b, 220c and 220d, the package 200 has a footprint that is considerably larger than the footprint of the package 100. While the packages 100 and 200 are depicted as a pin grid array, the skilled artisan will appreciate that a variety of other interconnection techniques may be used to provide electrical interconnection for the packages 100 and 200 and the semiconductor chips 120 and 220a, 220b, 220c and 220d enclosed therein.

In many respects, the difference in relative footprint size between the packages 100 and 200 is of no particular concern. In one respect, however, the size difference can impact manufacturing efficiency. It may be advantageous in certain circumstances to be able to simultaneously assemble groups of the packages 100 and 200 within the confines of a single apparatus. In this regard, attention is now turned to FIG. 3, which is a pictorial view of an exemplary embodiment of a package assembly apparatus 300, hereinafter ("apparatus 300"). The apparatus 300 includes five stations 310, 315, 320, 325 and 330. The station 310 is designed to receive quantities of the lids 110 and 210 that are temporarily seated in appropriately sized receptacles. In this embodiment, the receptacles may be cups. A first group of cups 335 is provided for the lids 110 and a second group of cups 340 may be provided for a group of the lids 210. The lids 110 and 210 may be delivered to the station 310 manually or by way of an automated loading device (not shown).

The station 315 is a lid preheater that is designed to preheat the lids 110 and 210 up to a desired temperature that is advantageous for establishing an appropriate bond with the adhesive beads 125 and 225. The station 315 includes two sets of receptacles or pedestals 345 and 350 that are designed to receive respective sets of ten lids 110. There are additionally two sets 355 and 360 of pedestals that are designed to receive sets of eight each of the lids 210. The pedestals in their respective sets 345, 350, 355 and 360 are dimensioned, that is, have individual footprints that generally track the size and shape of the lids 110 or 210 as the case may be. The lids 110 and 210 may be transferred from the station 310 to the station 315 by way of a three-axis pick-and-place mechanism 365. The pick-and-place mechanism 365 is operable to move in the X, Y and Z axes. The pick-and-place mechanism 365 may operate on suction, claw mechanisms or some other type of grasping mechanism in order to grasp the lids 110 and 210.

The station 330 is designed to receive quantities of the substrates 105 and 205 that include the semiconductor chips 120 and 220a, 220b, 220c and 220d already seated thereon. In this regard, the station 330 includes two sets of receptacles or cups 370 and 375 that each include ten cups that are sized to receive ten of the substrates 105 and their corresponding semiconductor chips 120. Two other sets 380 and 385 of cups are provided on the station 330 in order to receive eight each of the base substrates 205 and their corresponding chips 220a, 220b, 220c and 220d. The substrates 105 and 205 may be loaded onto the station 330 by way of a pick-and-place mechanism 390 that is operable to translate in the X, Y and Z axes.

The station 325 is designed to receive substrates from the work station 330 and thereafter receive lids from the station 315 so that the lids may be secured to the corresponding substrates and the adhesives used therein may be precured. In this regard, a pair of side-by-side press plates 395 and 400 are connected to a frame 405. The press plates 395 and 400 are designed to translate downward along the Z axis and compress lids to their corresponding underlying substrates to provide adequate adhesive bonding. The plates 395 and 400 may be translated along the Z axis by way of power screws 410 and 415 or some other type of translation mechanism as desired. Like the other stations 310 and 330, the station 325 is provided with a plurality of receptacles to receive the individual substrates 105 and 205 and thereafter their corresponding lids 110 and 210. In this regard, two sets of receptacles 420 and 425 each consisting of ten receptacles are provided to receive two pluralities of the substrates 105 and their corresponding lids 110. Two other sets 430 and 435 of receptacles, each including eight receptacles, are provided to receive respective pluralities of the substrates 205 and their corresponding lids 210.

The station 320 is provided to receive the assembled packages 100 and 200 following press and adhesive precure in the station 325. After delivery to the station 320, by way of the pick-and-place mechanism 365 or other movement device, the assembled packages 100 and 200 may be transferred out of the apparatus 300.

It should be understood that the apparatus 300 may be housed within an enclosure 440 that is shown in phantom. The processing stations 310, 315, 320, 325 and 330 may but not need be physically attached to one another. In addition, a control interface 445 may be provided on the enclosure 440 or elsewhere in the apparatus 300. The interface 445 may be a computer or other type of control apparatus that provides both control and status capabilities. The interface 445 may be configured to control the movements of the components of the packages 100 and 200 shown in FIG. 1.

Figure 4:
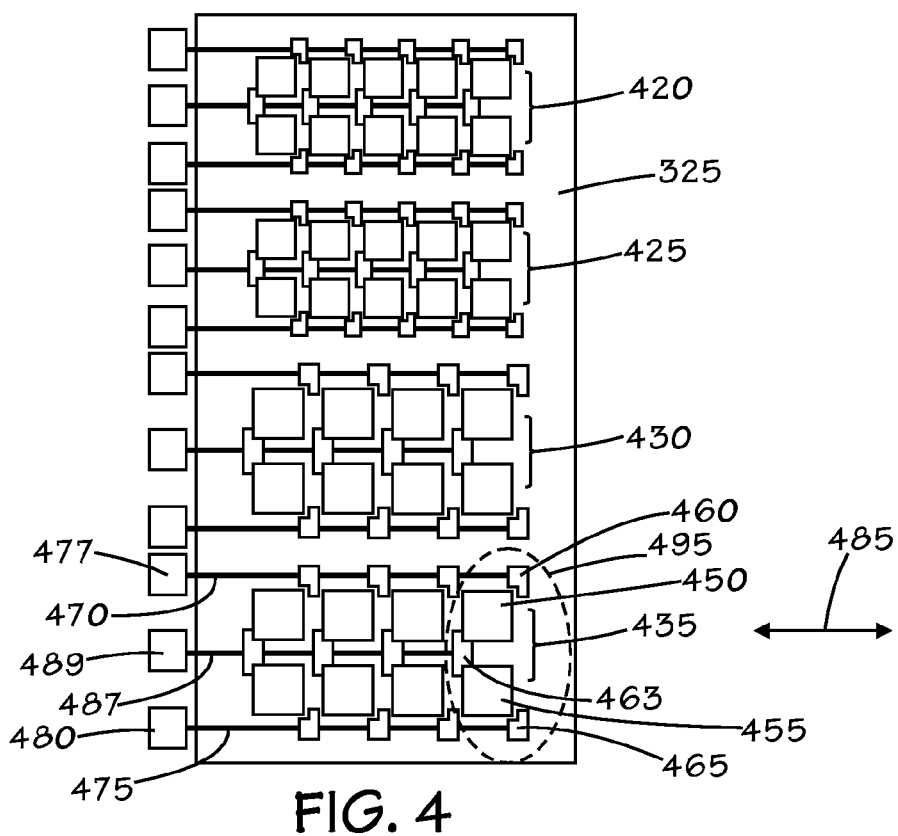
FIG. 4 is a plan view of an exemplary embodiment of a processing station of the apparatus shown in FIG. 4.

Additional detail regarding the station 325 may be understood by referring now to FIG. 4, which is an overhead view of the station 325. The sets 420 and 425 of receptacles dimensioned for the substrates 105 are shown as well as the sets 430 and 435 of receptacles that are dimensioned to receive the substrates 205. The set 435 of receptacles includes eight individual receptacles, two of which are labeled 450 and 455. The following description of the structure and function of the set 435 of receptacles will be illustrative of the other sets 420, 425 and 430. The receptacles 450 and 455 are dimensioned to accommodate the footprint of the packages 200 (see FIG. 1) so that the packages 200 may be placed on the receptacles 450 and 455. The terms "on" and "in" are used herein synonymously with regard to the placement of objects in a receptacle. Respective alignment brackets 460, 463 and 465 are provided for the receptacles 450 and 455. The alignment brackets 460 and 465 are connected to two shafts 470 and 475 respectively. The shafts 470 and 475 are in-turn connected to actuators 477 and 480, respectively, that are operable to move the shafts 470 and 475 along an axis 485. The alignment bracket 463 faces opposite to the alignment brackets 460 and 465 and is connected to a shaft 487 that is moveable axially along the axis 485 by an actuator 489. The alignment brackets 460 and 465 may be elbow-shaped and the alignment bracket 463 may be T-shaped as shown or have other shapes as desired. There are other alignment brackets associated with the remainder of the receptacles in the set 435 that are depicted but not separately labeled. A portion of the station 325 generally circumscribed by the dashed oval 495 is shown at greater magnification in FIG. 5 so that additional detail regarding the structure and function of the receptacles 450 and 455 may be understood.

Figure 5:
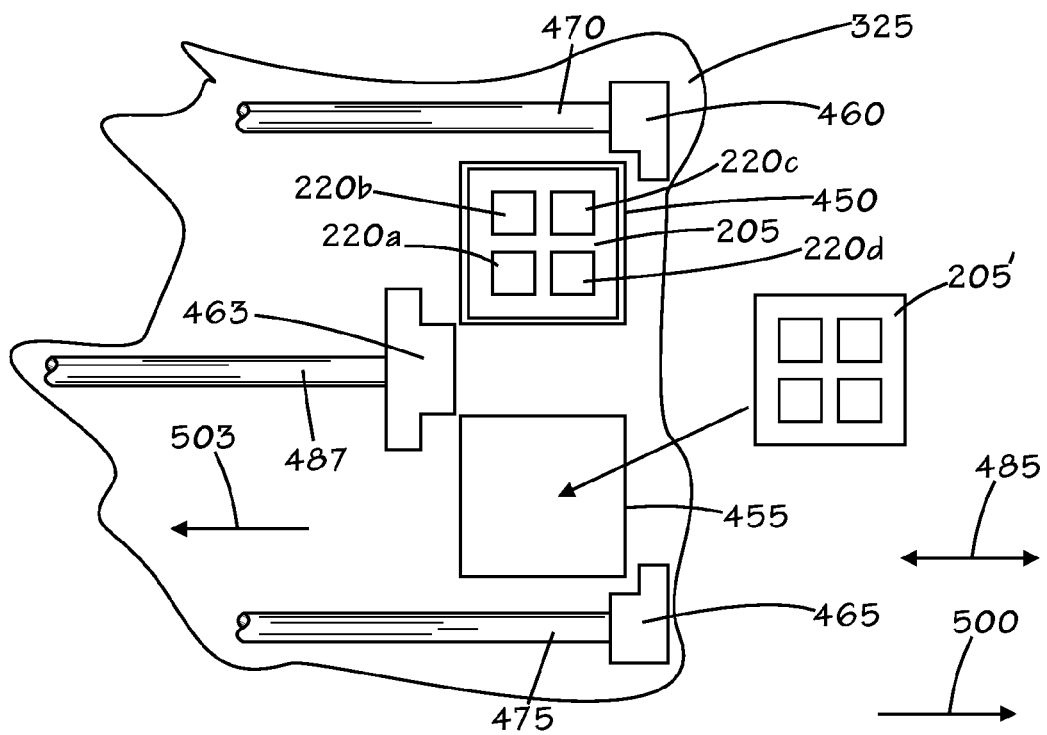
FIG. 5 is a magnified view of a portion of FIG. 4.

Attention is now turned to FIG. 5. A substrate 205 with its semiconductor devices 220a, 220b, 220c and 220d is shown seated in the receptacle 450. Another substrate 205' is shown just prior to seating in the receptacle 455. Note that the substrate 205 is seated in the receptacle 450 with its semiconductor devices 220a, 220b, 220c and 220d facing upwards as shown in FIG. 5. At this stage, the shafts 470 and 475 are translated in the direction 500 and the shaft 487 is translated in the direction 503 along the axis 485 so that adequate clearance is provided to place the substrates 205 and 205' into the receptacles 450 and 455. It should be understood that the substrates 205, 205', and 105 may be positioned in their respective receptacles 450, 455, etc. singly or in groups of eight or other numbers as desired.

Figure 6:
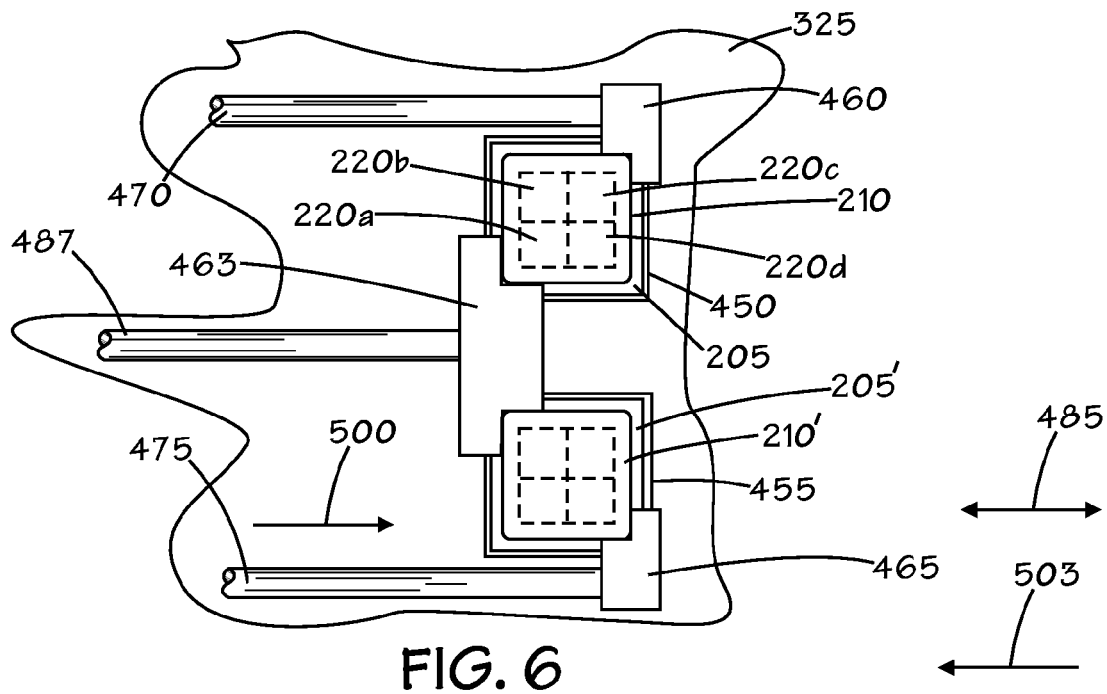
FIG. 6 is another magnified view of the portion of FIG. 4.

After the substrates 205, 205' and 105 are positioned in the receptacles 450, 455, etc. for the sets 420, 425, 430 and 435 as shown in FIG. 4, respective lids may be seated thereon. In this regard, attention is now turned to FIG. 6, which an overhead view like FIG. 5 but depicts the placement of respective lids 210 and 210' on substrates 205 and 205' in the receptacles 450 and 455. Note that the underlying semiconductor chips 220a, 220b, 220c and 220d for each of the substrates 205 and 205' are shown in phantom as they are otherwise obscured by the lids 210. After the lids 210 and 210' are positioned on their respective substrates 205 and 205', the shafts 470 and 475 may be moved in the direction of arrow 503 and the shaft 487 may be moved in the direction 500 along the axis 485 so that the alignment brackets 460, 463 and 465 engage the lids 210 and 210' in such a way that the lids 210 and 210' are effectively sandwiched between the alignment brackets 460 and 465 and the bracket 463 as shown. At this stage, and referring again to FIG. 3, the presses 395 and 400 may be brought into contact with all of the lids of the substrates on the station 325 and held there for an appropriate amount of time to enable the adhesives of the substrates 205 and 105 to take a precure.

After the precure is performed, the actuators 477, 480 and 489 depicted in FIG. 4 maybe turned on to move the shafts 470, 475, 487 etc. along the axis 485 to release engagement with the various lids 210, 210' and 110. At this point, a mechanism, such as the pick-and-place mechanism 365 or other type of movement mechanism depicted in FIG. 3, may be used to pick the assembled packages 100 and 200 (See FIG. 2) out of the station 325 and move them to the output station 320 for eventual delivery outside the apparatus 300.

While the illustrative embodiment uses two sets of ten receptacles each to accommodate the packages 100 and two sets of eight receptacles each to accommodate the packages 200, it should be understood that the number of receptacles for a given footprint may be varied as desired. Indeed, a given or all of the stations 310, 315, 320, 325 and 330 may be configured to accommodate more than two package footprints. Furthermore, the groups of receptacles may be bracketed, that is, the two groups of smaller footprint receptacles may be bracketed between the two groups of larger footprint receptacles.

Figure 7:
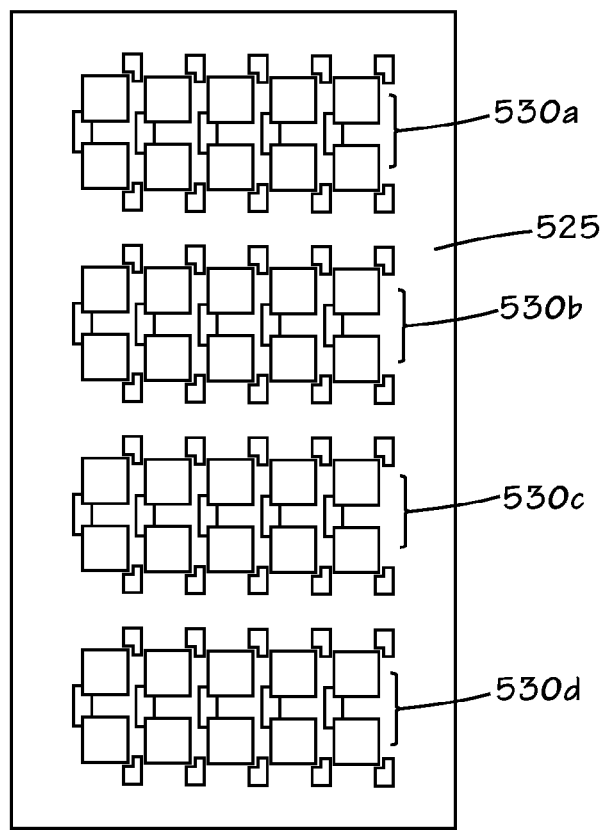
FIG. 7 is a plan view of a conventional processing station.

It may be useful at this point to contrast a conventional design for the stations of the apparatus 300. In this regard, FIG. 7 depicts an overhead view of a conventional station lid-to-substrate assembly station 525 that performs essentially the same functionality as the station 325 of the disclosed embodiment with some notable differences. In this regard, it should be noted that the station 525 includes four sets of receptacles 530a, 530b, 530c and 530d that are all dimensioned to receive packages 100 of the type depicted in FIG. 2, thus, there is no provision to handle different sized packages, particularly those that are larger than the package type 100 depicted in FIG. 2. The same dedication to a single package size is a feature of other conventional stations associated with the station 525. The station 525 may be found in the commercially-available LAS64 packaging machine offered by Dai-Ichi Seiko. Indeed, the LAS64 may be modified in accordance with embodiments disclosed herein.

An exemplary process flow for attaching the lids 110 and 210 to the substrates 105 and 205 will now be described in conjunction with FIGS. 2, 3 and 10. The process will be described in the context of an indium thermal interface material. However, the thermal interface material may be composed of a variety of metallic thermal interface materials, such as, for example, indium, gallium, platinum, gold, silver, combinations of these or the like. Mercury, if provided with suitable lateral barriers, such as, by way of a metal perimeter for example, could be used as a thermal interface material. Optionally, the thermal interface material may be composed of polymeric materials such as, for example, silicone rubber mixed with aluminum particles and zinc oxide. Optionally, compliant base materials other than silicone rubber and thermally conductive particles other than aluminum may be used. Thermal greases and gold, platinum and silver represent a few examples.

Figure 8:
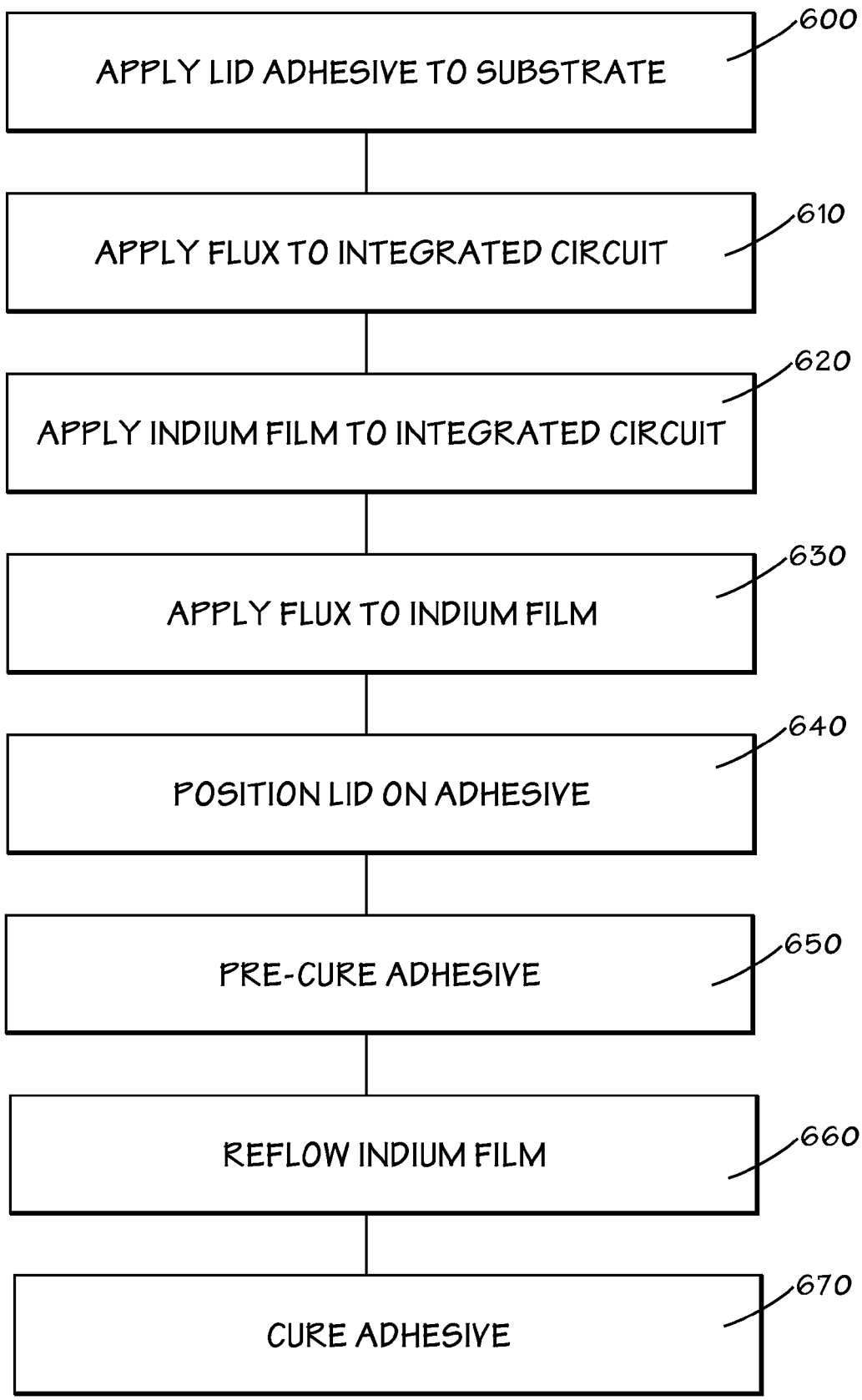
FIG. 8 is a flow chart of an exemplary semiconductor chip assembly process.

Following the mounting of the semiconductor chips 120 and 220a, 220b, 220c and 220d to the respective substrates 105 and 205, the adhesive films 125 and 225 are applied to the substrates 105 and 205 in step 600 of FIG. 8.

At step 810, a film of flux is applied to the semiconductor devices 120 and 220a, 220b, 220c and 220d. The purpose of the flux is to facilitate an ultimate metallurgical bonding between the later-applied indium thermal interface material and the devices 120 and 220a, 220b, 220c and 220d. A rosin-based flux is advantageously used as the flux material. In an exemplary embodiment, the flux may consist of about 20 to 50% by weight rosin mixed with isopropyl alcohol. A jet spray or other suitable application technique may be used to apply the flux.

At step 620, an indium thermal interface material is applied to the semiconductor devices 120 and 220a, 220b, 220c and 220d. This may be done in at least two ways. In this illustrative embodiment, preformed films of indium with roughly the same footprint as the devices 120 and 220a, 220b, 220c and 220d are applied. Alternatively, the preform may be secured to the lids 110 and 210 and the lids 110 and 210 in turn may be brought into contact with the devices 120 and 220a, 220b, 220c and 220d. The preformed indium thermal interface material may be supplied in a variety of forms. In an exemplary embodiment, preformed pieces of indium may be supplied on a tape that is positioned on a reel. The tape is advanced and individual preformed pieces or sheets of indium are removed from the tape and placed on the devices 120 and 220a, 220b, 220c and 220d. The movement of the indium preforms may be by hand, an automated pick-and-place mechanism or other type of mechanism. The ultimate uniformity in terms of thickness and material distribution of the indium thermal interface material is a function of the degree of tilt of the lids 110 and 210 with respect to their substrates 105 and 205. It is desirable for the degree of tilt to be as small as possible. The indium thermal interface material will require a reflow process to establish the desired metallurgical bonding with the lids 110 and 210 and the devices 120 and 220a, 220b, 220c and 220d. It is desired that the reflow process not adversely impact the tilt characteristics of the lids 110 and 220. Accordingly, it is preferable to perform a pre-cure process on the adhesives 125 and 225. The goal of the precure process is to partially harden the adhesives 125 and 225 before the indium thermal interface material undergoes a reflow. In this way, the reflow process will not cause substantial movement either laterally or vertically of the adhesive film and thus the overlying lids 110 and 210 during the indium reflow process.

Prior to precure, flux is applied to the indium film at step 630 and the lids 110 and 210 are seated on the adhesive films 125 and 225 at step 640. A rosin-based flux of the type described elsewhere herein may be used. The substrates 105 and 205 may be positioned in the processing station 325 shown in FIG. 3 at this point. The seating process at step 640 may be accomplished by hand with the aid of well-known guide racks or by way of the pick-and-place mechanism 365 shown in FIG. 3. The lids 110 and 210 may be preheated prior to seating on the adhesives 125 and 225. For example, the lids 110 and 210 may be heated to about 100 to 135° C. for 5.0 to 10.0 minutes. The preheat may take place at the processing station 315 shown in FIG. 3. The preheated lids 110 and 210 are next seated on the adhesives 125 and 225. It is anticipated that the temperature of the lids 110 and 210 will drop by perhaps 10.0 to 15.0° C. before being seated on the adhesives 125 and 225.

Figure 3:
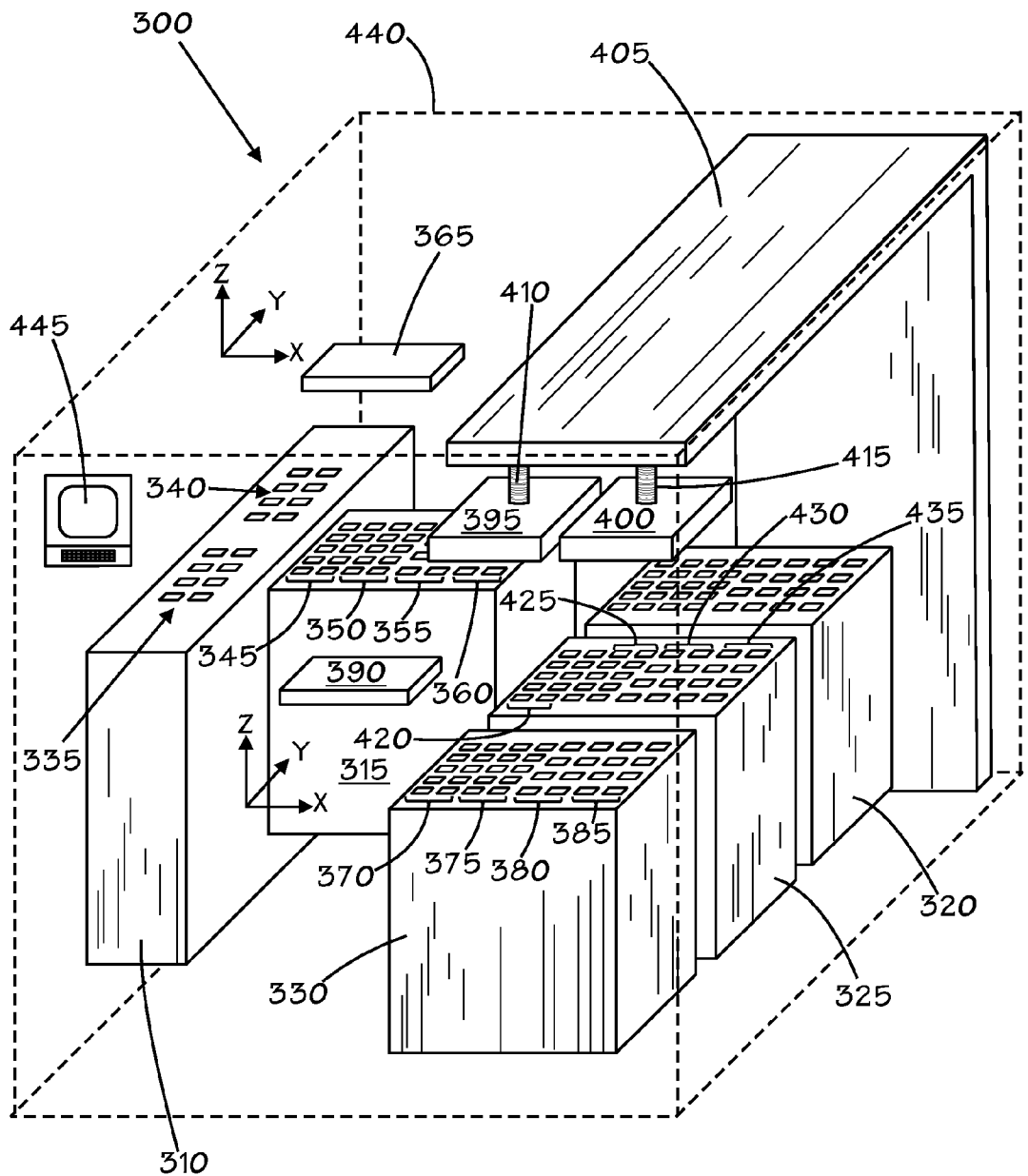
FIG. 3 is a pictorial view of an exemplary embodiment of a packaging apparatus.

With compressive force applied by, for example, the presses 395 and 400 in FIG. 3, the substrates 105 and 205 and lids 110 and 210 combinations are subjected to a precure heating at step 650. Suitable temperatures and times for the precure will depend on the adhesive and the thermal interface material. Fast curing adhesives may require as little as about 2.0 minutes at 100° C., however, a precure time of up to an hour will be more typical. The precure process will fix the indium bond line thickness, that is, the thickness of the thermal interface material. The presses 395 and 400 themselves may supply the heat.

Following the precure at step 650, an indium reflow step is performed at step 660. In an exemplary process for indium, the packages 100 and 200 may be placed in a belt furnace with a nitrogen purge, and heated to about 170 to 190° C. for about 3.0 to 10.0 minutes. The reflow is advantageously performed without compressive force applied to the lids 110 and 210. Again, the goal of the indium reflow is to establish metallurgical bonding between the indium thermal interface material and the overlying lids 110 and 210. A wetting film of gold (not shown) may be used to aid the bonding.

Following the indium reflow step 660, the adhesive films 125 and 225 undergo a final curing process at step 670. The curing process is performed without compressive force applied to the lids 110 and 210. The final cure may be performed at about 125° C. for about 1.5 hours. Again the temperature and time will depend on the adhesive used.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
 placing a first set of semiconductor chip package substrates in a first group of receptacles of a first processing station, each of the first set of semiconductor chip package substrates having a first footprint, the receptacles of the first group being dimensioned to accommodate the first footprint;
 placing a second set of semiconductor chip package substrates in a second group of receptacles of the first processing station, each of the second set of semiconductor chip package substrates having a second footprint larger than the first footprint, the receptacles of the second group being dimensioned to accommodate the second footprint; and
 placing a first set of lids on the first set of semiconductor chip package substrates and a second group of lids on the second set of semiconductor chip package substrates.

2. The method of claim 1, wherein the placing first and second sets of lids comprises placing adhesive on the first and second sets of semiconductor chip package substrates to engage the first and second sets of lids.

3. The method of claim 2, comprising pressing the first and second sets of lids against the first and second sets of semiconductor chip package substrates.

4. The method of claim 1, comprising preheating the first and second sets of lids prior to placement on the first and second sets of semiconductor chip package substrates.

5. The method of 4, wherein the preheating is performed in a second processing station.

6. The method of claim 5, wherein the second processing station includes a first group receptacles dimensioned to accommodate respective of the first set of lids and a second group of receptacles dimensioned to accommodate respective of the second set of lids.

7. The method of claim 1, wherein the first and second sets of semiconductor chip package substrates are placed by a first pick-and-place mechanism.

8. The method of claim 1, wherein the first and second sets of lids are placed by a second pick-and-place mechanism.

9. The method of claim 1, wherein the movement of the first and second sets of semiconductor chip package substrates and first and second sets of lids is controlled by a computer.

10. The method of claim 1, wherein each of the second set of semiconductor chip package substrates comprises a plurality of semiconductor chips coupled to a substrate.

11. The method of claim 1, wherein each of the second set of semiconductor chip package substrates comprises a multi-processor core semiconductor chip coupled to a substrate.

12. A method of manufacturing, comprising:
placing a first set of semiconductor chip package substrates in a first group of receptacles of a first processing station, each of the first set of semiconductor chip package substrates including a semiconductor chip coupled thereto and having a first footprint, the receptacles of the first group being dimensioned to accommodate the first footprint;
placing a second set of semiconductor chip package substrates in a second group of receptacles of the first processing station, each of the second set of semiconductor chip package substrates including a plurality of semiconductor chip cores coupled thereto and having a second footprint larger than the first footprint, the receptacles of the second group being dimensioned to accommodate the second footprint; and
placing a first set of lids on the first set of semiconductor chip package substrates and a second group of lids on the second set of semiconductor chip package substrates.

13. The method of claim 12, wherein the placing first and second sets of lids comprises placing adhesive on the first and second sets of semiconductor chip package substrates to engage the first and second sets of lids.

14. The method of claim 13, comprising pressing the first and second sets of lids against the first and second sets of semiconductor chip package substrates.

15. The method of claim 12, comprising preheating the first and second sets of lids prior to placement on the first and second sets of semiconductor chip package substrates.

16. The method of 15, wherein the preheating is performed in a second processing station.

17. The method of claim 16, wherein the second processing station includes a first group receptacles dimensioned to accommodate respective of the first set of lids and a second group of receptacles dimensioned to accommodate respective of the second set of lids.

18. The method of claim 12, wherein the first and second sets of semiconductor chip package substrates are placed by a first pick-and-place mechanism.

19. The method of claim 12, wherein the first and second sets of lids are placed by a second pick-and-place mechanism.

20. The method of claim 12, wherein the movement of the first and second sets of semiconductor chip package substrates and first and second sets of lids is controlled by a computer.

21. An apparatus, comprising:
a first processing station including a first group of receptacles dimensioned to accommodate semiconductor chip package substrates having a first footprint and a second group of receptacles dimensioned to accommodate semiconductor chip package substrates having a second footprint larger than the first footprint and wherein the first and second groups or receptacles are adapted to receive a first set of lids on the semiconductor chip package substrates having the first footprint and a second set of lids on the semiconductor chip package substrates having a second footprint.

22. The apparatus of claim 21, comprising a first pick-and-place mechanism to place the semiconductor chip package substrates in the first and second groups of receptacles.

23. The apparatus of claim 21, comprising a first mechanism to press the first set of lids against the semiconductor chip package substrates having the first footprint and s second mechanism to press the second set of lids against the semiconductor chip package substrates having the second footprint.

24. The apparatus of claim 21, comprising a second first pick-and-place mechanism to place the first set of lids on the semiconductor chip package substrates having the first footprint and the second group of lids on the semiconductor chip package substrates having the second footprint.

25. The apparatus of claim 21, comprising a second processing station to heat a first set of lids adapted to be placed on the semiconductor chip package substrates having the first footprint and a second set of lids adapted to be placed on the semiconductor chip package substrates having the second footprint.

26. The apparatus of claim 25, wherein the first set of lids has third footprint and the second set of lids has a second processing station includes a third group of receptacles dimensioned to accommodate the first set of lids having a third footprint and a fourth group of receptacles dimensioned to accommodate the second set of lids having a fourth footprint larger than the third footprint.

27. The apparatus of claim 21, comprising a computer to control the movement of the movement of the Semiconductor chip package substrates to and from the first processing station.

* * * * *